United States Patent
Tan et al.

(10) Patent No.: US 11,747,292 B2
(45) Date of Patent: Sep. 5, 2023

(54) CHARGED PARTICLE BEAM APPARATUS

(71) Applicant: Hitachi High-Tech Corporation, Tokyo (JP)

(72) Inventors: Wei Chean Tan, Tokyo (JP); Hiroyuki Chiba, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 0 days.

(21) Appl. No.: 17/287,246

(22) PCT Filed: Mar. 20, 2019

(86) PCT No.: PCT/JP2019/011650
§ 371 (c)(1),
(2) Date: Apr. 21, 2021

(87) PCT Pub. No.: WO2020/188781
PCT Pub. Date: Sep. 24, 2020

(65) Prior Publication Data
US 2021/0383519 A1 Dec. 9, 2021

(51) Int. Cl.
*G01N 23/2251* (2018.01)
*G06T 5/00* (2006.01)
(Continued)

(52) U.S. Cl.
CPC ......... *G01N 23/2251* (2013.01); *G06T 5/002* (2013.01); *G06T 5/50* (2013.01);
(Continued)

(58) Field of Classification Search
CPC .......... H01J 37/28; H01J 37/20; H01J 37/222; H01J 37/244; H01J 2237/2817;
(Continued)

(56) References Cited

U.S. PATENT DOCUMENTS

2009/0212213 A1* 8/2009 Nakasuji ............... H01J 37/28
250/310
2011/0249885 A1* 10/2011 Murakawa ............. G03F 1/74
382/144
(Continued)

FOREIGN PATENT DOCUMENTS

JP 2-253550 A 10/1990
JP 2011-221350 A 11/2011
(Continued)

OTHER PUBLICATIONS

International Search Report (PCT/ISA/210) issued in PCT Application No. PCT/JP2019/011650 dated Jun. 18, 2019 with English translation (five (5) pages).
(Continued)

*Primary Examiner* — Masum Billah
(74) *Attorney, Agent, or Firm* — Crowell & Moring LLP

(57) ABSTRACT

The charged particle beam apparatus includes a charged particle beam optical system that irradiates a sample mounted on a sample stage with a charged particle beam; a detector that detects a signal generated from the sample; a charged particle beam imaging device that acquires an observation image from the signal detected by the detector; an optical imaging device that captures an optical image of the sample; a stage that rotatably holds the sample stage; a stage control device that controls movement and rotation of the stage; and an image composition unit that combines the plurality of optical images to generate a composite image. The stage control device is configured to move the stage so that the center of an imaging range of the optical imaging device is located at a position different from the rotation center of the stage and then, to rotate the stage, the optical imaging device acquires a plurality of optical images relating to different positions of the sample by rotation operation,
(Continued)

and the image composition unit combines the plurality of optical images obtained by the rotation operation to generate a composite image.

12 Claims, 11 Drawing Sheets

(51) Int. Cl.
    *G06T 5/50*           (2006.01)
    *H04N 7/18*          (2006.01)
    *H04N 23/56*        (2023.01)
    *H04N 23/74*        (2023.01)
    *H04N 23/90*        (2023.01)

(52) U.S. Cl.
    CPC .............. *H04N 7/181* (2013.01); *H04N 23/56* (2023.01); *H04N 23/74* (2023.01); *H04N 23/90* (2023.01); *G01N 2223/07* (2013.01); *G01N 2223/418* (2013.01); *G01N 2223/507* (2013.01); *G06T 2207/10061* (2013.01); *G06T 2207/20221* (2013.01)

(58) Field of Classification Search
    CPC ............... H01J 37/185; H01J 2237/221; H01J 2237/30438; H01J 2237/31732; H01J 2237/31745
    USPC .......................................................... 348/80
    See application file for complete search history.

(56) References Cited

U.S. PATENT DOCUMENTS

| | | |
|---|---|---|
| 2012/0092482 A1 | 4/2012 | Shinoda et al. |
| 2014/0092231 A1* | 4/2014 | Nakahira ................ H01J 37/26 348/80 |
| 2015/0332891 A1* | 11/2015 | Bierhoff ................. H01J 37/26 250/307 |
| 2018/0323035 A1 | 11/2018 | Chiba et al. |
| 2019/0148105 A1 | 5/2019 | Koyanagi et al. |

FOREIGN PATENT DOCUMENTS

| | | |
|---|---|---|
| JP | 2013-33760 A | 2/2013 |
| JP | 2013-239447 A | 11/2013 |
| WO | WO 2007/143734 A2 | 12/2007 |
| WO | WO 2010/114117 A1 | 10/2010 |
| WO | WO 2017/090100 A1 | 6/2017 |
| WO | WO 2017/216941 A1 | 12/2017 |

OTHER PUBLICATIONS

Japanese-language Written Opinion (PCT/ISA/237) issued in PCT Application No. PCT/JP2019/011650 dated Jun. 18, 2019 (three (3) pages).

* cited by examiner

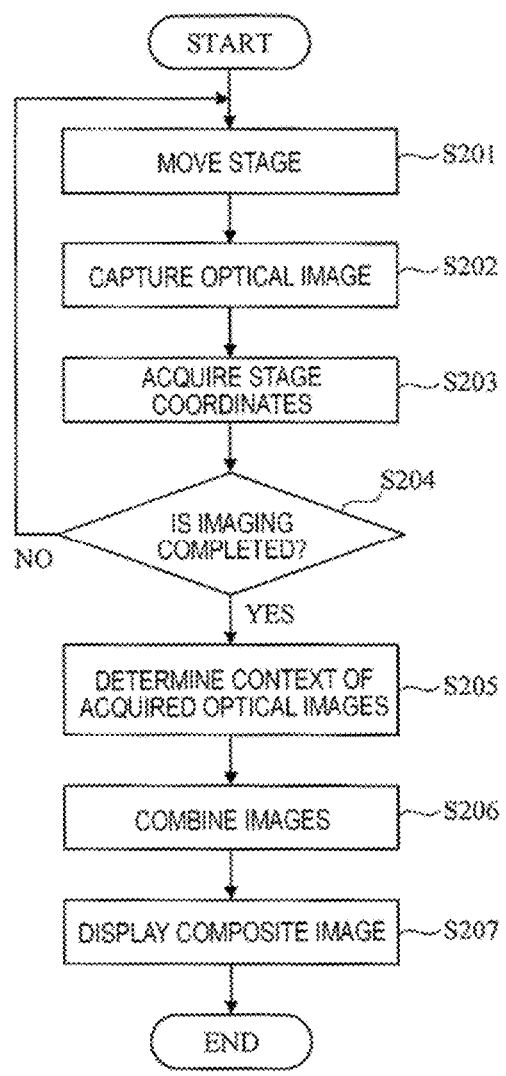
[FIG. 2]

FIG. 4A
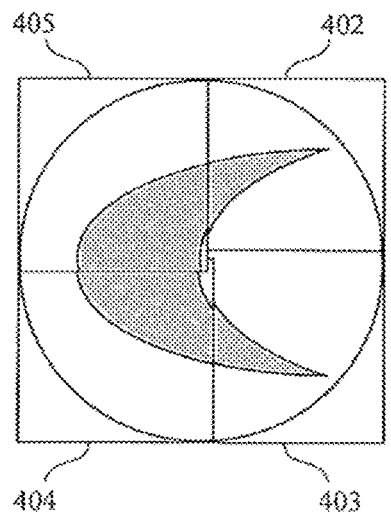
FIG. 4B
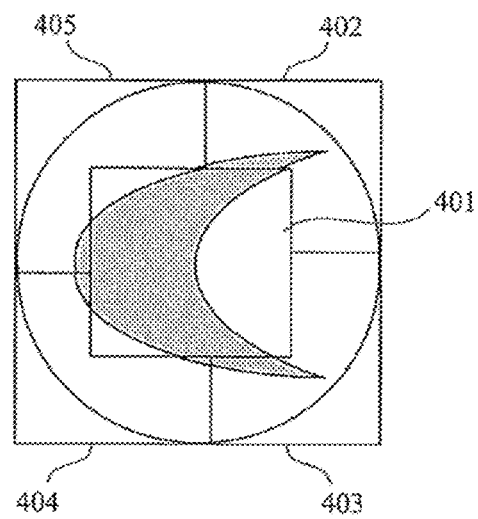
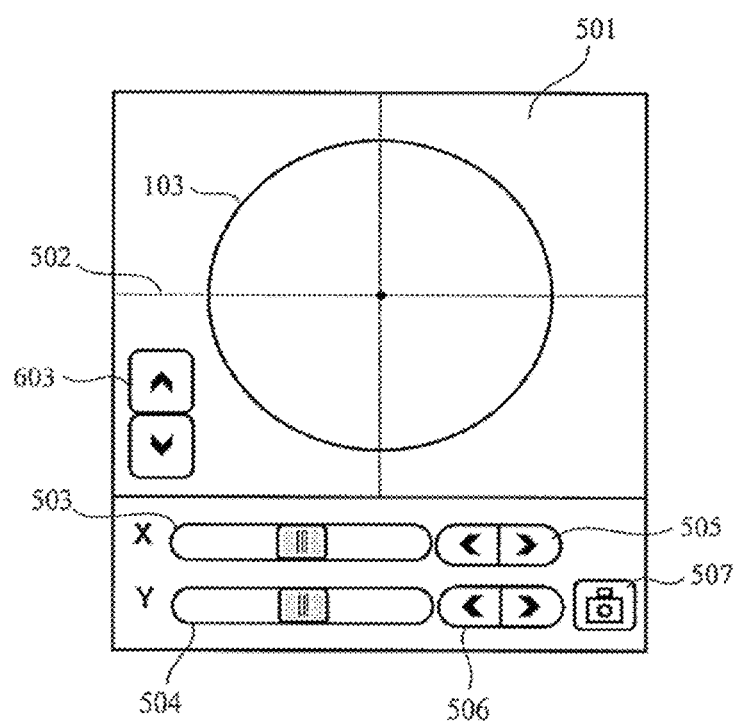
FIG. 5

CHARGED PARTICLE BEAM APPARATUS

TECHNICAL FIELD

The present invention relates to a charged particle beam apparatus.

BACKGROUND ART

A scanning electron microscope (hereinafter, referred to as an "SEM") which is a type of a charged particle beam apparatus is a device that is configured to irradiate a sample with an electron beam emitted from an electron source and observes a surface image of the sample. Generally, in the SEM, the sample is observed as close as possible to the objective lens in order to obtain high resolution. For this reason, the distance between the objective lens and the sample becomes short and it is generally difficult to observe a wide field of view. On the other hand, since the sample to be observed is generally larger than the size of the field of view that can be observed by the SEM, it is not easy to search for a location to be observed only by the SEM image. For this reason, an SEM that employs an optical observation system for the navigation purpose separately from an electron observation system is known (for example, see JP-A-2013-33760 (PTL 1) and International Publication No. 2017/216941 (PTL 2)). In this SEM, an optical image having a magnification lower than the minimum magnification of the electron observation system is acquired, the current observation position is displayed at low magnification by the optical image, and in addition, the position to which a stage is to be moved next can be designated on such a low-magnification optical image.

In a charged particle beam apparatus that displays such a low-magnification optical image for navigation purposes, it is required to more accurately and easily grasp the low-magnification image of the sample.

CITATION LIST

Patent Literature

PTL 1: JP-A-2013-33760
PTL 2: International Publication No. 2017/216941

SUMMARY OF INVENTION

Technical Problem

The present invention has been made in consideration of the above-described problems and an object thereof is to provide a charged particle beam apparatus capable of accurately and easily grasping a low-magnification image of a sample.

Solution to Problem

A charged particle beam apparatus according to a first aspect of the present invention includes a charged particle beam optical system that irradiates a sample mounted on a sample stage with a charged particle beam; a detector that detects a signal generated from the sample; a charged particle beam imaging device that acquires an observation image from the signal detected by the detector; an optical imaging device that captures an optical image of the sample; a stage that rotatably holds the sample stage; a stage control device that controls movement and rotation of the stage; and an image composition unit that combines a plurality of optical images to generate a composite image. The stage control device is configured to move the stage so that the center of an imaging range of the optical imaging device is located at a position different from the rotation center of the stage and then to rotate the stage, the optical imaging device acquires the plurality of optical images relating to different positions of the sample by rotation operation, and the image composition unit combines the plurality of optical images obtained by the rotation operation to generate a composite image.

In the charged particle beam apparatus according to the first aspect, the stage control device moves the stage so that the center of the imaging range of the optical imaging device is located at a position different from the rotation center of the stage, and then, rotates the stage. When the imaging of the sample is performed at a plurality of rotation angles and a plurality of optical images are obtained, it is possible to obtain a low-magnification image of the sample by combining the images. In addition, in this first aspect, since the stage control device performs the rotation operation after moving the rotation center of the stage from the center of the imaging range of the optical imaging device, it is possible to obtain a low-magnification image of the sample while keeping the movement range of the stage to a minimum. For this reason, since the movable range of the stage can be reduced, there is an advantage that a large vacuum sample chamber becomes unnecessary.

In addition, a charged particle beam apparatus according to a second aspect of the present invention includes a charged particle beam optical system that irradiates a sample mounted on a sample stage with a charged particle beam; a detector that detects a signal generated from the sample; a charged particle beam imaging device that acquires an observation image from the signal detected by the detector; an optical imaging device that captures an optical image of the sample; a stage that rotatably holds the sample stage; a stage control device that controls the stage; an image composition unit that combines a plurality of optical images to generate a composite image; an image context control unit that controls the context of the plurality of optical images; and a display unit that displays the composite image. The image composition unit combines the plurality of optical images according to the context.

In the charged particle beam apparatus according to the second aspect, when the plurality of optical images are obtained by moving the optical imaging device of the stage with respect to the imaging range, the context of the optical images is controlled by the image context control unit, and the plurality of optical images are combined by the image composition unit according to the context. By performing the combining in consideration of the context, even when a plurality of optical images are combined, the composite image can be generated by reducing a step difference (seam) between the plurality of images.

Further, a charged particle beam apparatus according to a third aspect of the present invention includes a charged particle beam optical system that irradiates a sample mounted on a sample stage with a charged particle beam; a detector that detects a signal generated from the sample; a charged particle beam imaging device that acquires an observation image from the signal detected by the detector; an optical imaging device that captures an optical image of the sample; a stage that rotatably holds the sample stage; a stage control device that controls the stage; an image composition unit that combines a plurality of optical images to generate a composite image; an image context control unit that controls the context of the plurality of optical images; and a display unit that displays the composite image. When an observation position observed by the charged particle beam apparatus satisfies a predetermined condition, the optical imaging device captures an image of the sample at the observation position, and the image composition unit re-generates the composite image by using the captured image.

According to the charged particle beam apparatus according to the third aspect, if the observation is started by the charged particle beam apparatus after a composite image is generated by combining the plurality of optical images acquired by the optical imaging device, when the observation position satisfies a predetermined condition, the optical imaging device re-captures an image of the sample at the observation position. A composite image is generated by using this newly captured optical image. According to the aspect, at the observation position, it is possible to observe a composite image without a step difference (seam) that may occur at a boundary between the images.

Advantageous Effects of Invention

According to the present invention, it is possible to provide a charged particle beam apparatus capable of accurately and easily grasping a low-magnification image of a sample for navigation.

BRIEF DESCRIPTION OF DRAWINGS

FIG. 2 is a flowchart illustrating a processing procedure for generating a composite image which is an entire image of a sample 108 in the charged particle beam apparatus according to the first embodiment.

FIGS. 4A and 4B are schematic diagrams schematically illustrating a method of combining the plurality of optical images acquired by the procedure as illustrated in FIGS. 3A to 3E.

FIG. 5 is an example of an interface screen for executing a procedure from the capturing of the optical image to the displaying of the composite image.

DESCRIPTION OF EMBODIMENTS

Figure 1:
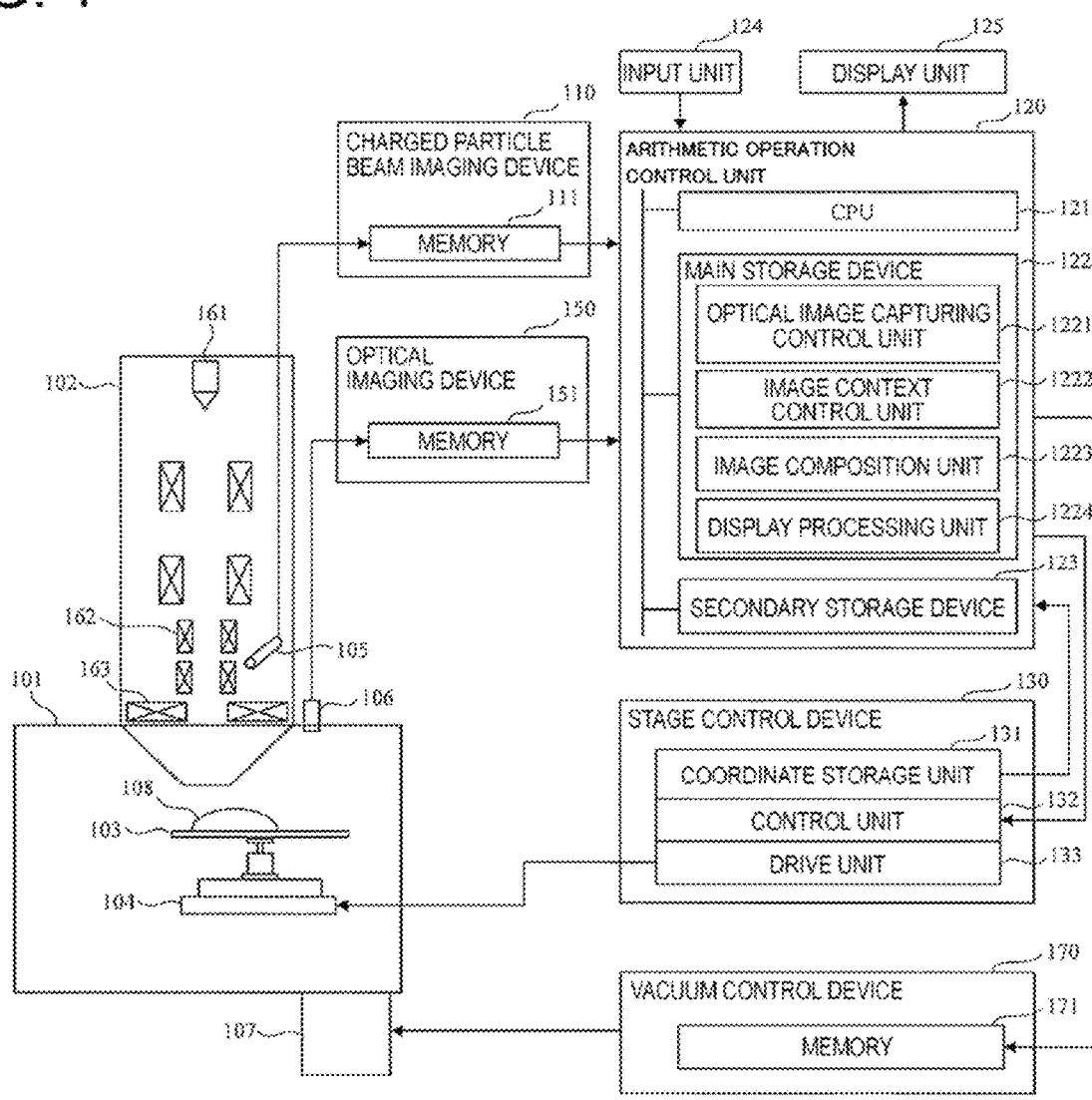
FIG. 1 is an example of a schematic view of a charged particle beam apparatus according to a first embodiment of the present invention.

Hereinafter, the present embodiment will be described with reference to the accompanying drawings. In the accompanying drawings, in some cases, components that are functionally the same may be denoted by the same reference numerals or the corresponding reference numerals. It is noted that the accompanying drawings illustrate embodiments and implementation examples in accordance with the principles of the present disclosure, but the accompanying drawings are provided for the purpose of understanding the present disclosure and are not intended to limit the interpretation of the present disclosure. The description of the present specification is merely a typical example and does not limit the scope of the claims or the application examples of the present disclosure in any way.

In this embodiment, the description is made sufficiently in detail for those skilled in the art to implement the present disclosure, but it should be understood that other implementations and embodiments are also possible and changes in the configuration and structure and replacement of various elements are possible, without departing from the scope and spirit of the technical idea of the present disclosure. Therefore, the following description should not be construed as limited thereto.

First Embodiment (Overall Configuration)

The overall configuration of the charged particle beam apparatus according to the first embodiment will be described with reference to FIG. 1. As an example, this charged particle beam apparatus is roughly configured with a sample chamber 101, a charged particle beam optical system 102, a sample stage 103, a stage 104, a vacuum pump 107, a charged particle beam imaging device 110, an arithmetic operation control unit 120, a stage control device 130, an optical imaging device 150 and a vacuum control device 170.

The sample chamber 101 has the function of maintaining the inside thereof in a vacuum state so as not to scatter charged particle beams and is configured so that a sample can be mounted the inside thereof. The evacuation operation of the sample chamber 101 can be performed by the vacuum control device 170 controlling the vacuum pump 107. The vacuum control device 170 can include a memory 171 for storing various parameters and the like related to the evacuation control.

The charged particle beam optical system 102 has a function of causing an electron source 161 to emit an electron beam, deflecting and focusing the electron beam by, for example, a deflector 162 and an objective lens 163, and irradiating the sample 108 mounted on the sample stage 103. The configuration of FIG. 1 is an example, and thus, the charged particle beam optical system 102 may include other lenses and electrodes in addition to the elements illustrated in the drawings or may be replaced with similar elements, and detailed configurations are not limited to the illustration.

The sample stage 103 is mounted on the stage 104. The stage 104 is configured so that the sample stage 103 can be moved inside the sample chamber 101 in the XY directions (vertical direction and horizontal direction) and rotatably holds the sample stage 103 about the rotation axis. The control of the stage 104 is executed by the stage control device 130 according to an arithmetic operation result of the arithmetic operation control unit 120 and the like. The stage control device 130 moves the sample stage 103 relative to the optical imaging device 150. The detector 105 has a function of detecting electrons (backscattered electrons, secondary electrons) and the like emitted from the sample 108. Although only one detector 105 is illustrated in FIG. 1, it is needless to say that the number and position of the detectors 105 are not limited to specific ones. In the charged particle beam apparatus according to the first embodiment, the stage 104 is configured to be rotatable in the XY directions. Due to the rotation operation of the stage 104, the sample 108 is moved relative to an imaging range (field of view) of the optical camera 106, and thus, optical images at a plurality of locations of the sample 108 can be acquired. The optical images at the plurality of locations are combined to acquire an entire image of the sample 108 for navigation use.

The charged particle beam imaging device 110 has the function of converting a signal detected by the detector 105 into an image and includes a memory 111 for storing information of the signal inside thereof. In addition, the optical imaging device 150 has the function of capturing an optical image of the sample 108 inside the sample chamber 101 with the optical camera 106 and converting the imaging signal thereof into an optical image. The optical imaging device 150 includes a memory 151 for storing the optical image inside the optical imaging device 150.

The arithmetic operation control unit 120 is a control unit that controls various components of the charged particle beam apparatus according to observation conditions and the like input from a user and controls the display of observation results. The arithmetic operation control unit 120 is configured with an information processing device such as a computer. As an example, the arithmetic operation control unit 120 includes a CPU (processor) 121, a main storage device 122 such as a memory, and a secondary storage device 123 such as a hard disk drive (HDD) and a solid state drive (SSD) therein. In addition, the arithmetic operation control unit 120 includes an input unit 124 such as a keyboard, a mouse, a touch monitor, or the like, a display unit 125 such as a liquid crystal display, or the like, and a communication unit (not illustrated) that communicates with each component of the charged particle beam apparatus.

The main storage device 122 stores a computer program that controls the operation of the entire charged particle beam apparatus. The computer program provides an optical image capturing control unit 1221, an image context control unit 1222, an image composition unit 1223, a result display unit 1224, and the like as functional blocks in the main storage device 122. The optical image capturing control unit 1221 is a control unit for controlling a position that acquires an optical image. In addition, the image context control unit 1222 controls the context of a plurality of images captured by the optical imaging device 150. Further, the image composition unit 1223 combines the captured optical image based on the stage coordinates, the stage rotation angle, the magnification, and the context of the image. In addition, the result display unit 1224 causes the display unit 125 to display the processed result (composite image or the like).

The stage control device 130 includes a coordinate storage unit 131, a control unit 132, and a drive unit 133. The coordinate storage unit 131 stores the coordinates of the stage 104. The control unit 132 controls the operation of the entire stage control device 130. The drive unit 133 generates a drive signal to drive the stage 104. The control unit 132 acquires the stage coordinate information from the coordinate storage unit 131 and transmits the stage coordinate information to the arithmetic operation control unit 120. Therefore, the arithmetic operation control unit 120 can know the coordinate position of the captured image. The stage coordinates may be stored in the stage control device 130 or may be stored in the arithmetic operation control unit 120.

(Procedure for Generating Composite Image)

A processing procedure for generating a composite image (optical image) which is an entire image of the sample 108 will be described with reference to the flowchart of FIG. 2.

First, in step S201, the arithmetic operation control unit 120 generates a control signal indicating the stage moving position and outputs the control signal to the stage control device 130. The stage control device 130 controls the stage 104 so that the field of view of the optical camera 106 is moved to the moving position indicated by the control signal. After the completion of the movement, the sample 108 is imaged by the optical camera 106.

Subsequently, in step S202, the arithmetic operation control unit 120 receives the optical image captured by the optical camera 106 and transmitted to the optical imaging device 150 and stores the optical image in the memory 151. The command to store the optical image in the memory 151 may be given from the arithmetic operation control unit 120 or may be given from the inside of the optical imaging device 150.

Then, in step S203, the arithmetic operation control unit 120 acquires the stage coordinates at the time of imaging in step S202 from the stage control device 130 and stores the stage coordinates in the main storage device 122. The execution order of steps S202 and S203 may be reversed. Then, it is determined in step S204 whether or not the entire imaging at the plurality of locations required for generating a composite image is completed. If the process is completed, the process proceeds to step S205, and if the process is not completed, steps S201 to S203 are repeated.

Next, in step S205, the context of the image acquired in step S202 is controlled by the image context control unit 1222. The context of the image may be determined according to a determination criterion stored in the main storage device 122 or the like in advance or may be determined by allowing the user to select images by using the user interface. In addition, the context may be determined based on the result obtained by performing the image processing on the acquired image.

When the context is determined, in step S206, the image composition unit 1223 generates a composite image based on stage coordinate information acquired in step S202 and information of the context. Then, in step S207, the composite image is displayed on the display unit 125. The processes of steps S205 to S207 may be executed after the image acquisition in step S204 is completed or may be executed at any time when the image is acquired.

FIGS. 3A to 3E illustrate a procedure for acquiring (image capturing) a plurality of images constituting the composite image, and FIGS. 4A and 4B schematically describe a method of combining the plurality of optical images acquired by the procedure as illustrated in FIGS. 3A to 3E. The drawings on the left side of FIGS. 3A to 3E are schematic views illustrating the relationship between the sample stage 103 and the sample 108 placed on the sample stage 103, and the imaging range 303 of the optical camera 106. In addition, the drawings on the right side of FIGS. 3A to 3E illustrate an example of the optical image 305 captured in the imaging range 303 illustrated on the left side.

Generally, the imaging range 303 is smaller than the sample 108, and the appearance of the entire sample 108 cannot be grasped by one optical image 305. For this reason, in the charged particle beam apparatus according to the first embodiment, the stage 104 is moved so that the center of the imaging range of the optical imaging device 150 is located at a position different from the rotation center of the stage 104 and then, the rotation operation of the stage 104 is performed. The optical imaging device 150 captures and acquires a plurality of optical images relating to different positions (rotation angles) of the sample 108 by the rotation operation, and the image composition unit 1223 generates a composite image by combining the plurality of optical images. In FIGS. 3A to 3E and 4A and 4B, the example where five optical images (including one image in the center and four images in the periphery) are captured is illustrated, but the number of captured images and the positional relationship between the plurality of images are not limited to the examples illustrated in FIGS. 3A to 3E and 4A and 4B. In addition, a degree of overlap between the plurality of images is not limited to those illustrated.

Figure 3A:
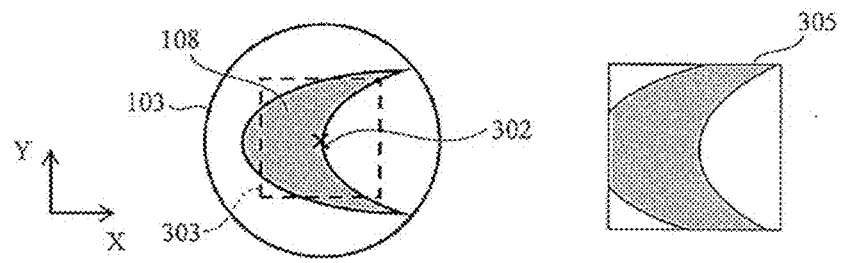
FIGS. 3A to 3E are schematic diagrams illustrating a procedure for acquiring (image capturing) a plurality of optical images at different positions of the sample 108 in the charged particle beam apparatus according to the first embodiment.

FIG. 3A illustrates a state in which the rotation center 302 of the stage 104 is located at the center of the imaging range 303 and the optical image 305 acquired in this state includes most of the sample 108 including the central portion of the sample 108.

Figure 3B:
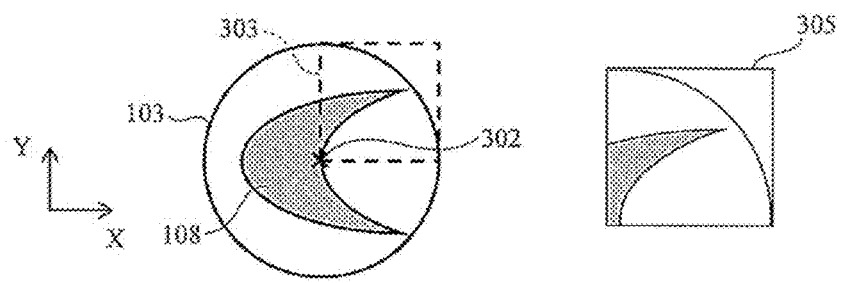

FIG. 3B illustrates a state in which the upper right portion of the sample stage 103 is included in the imaging range 303 by moving the stage 104 in the XY direction from the state illustrated in FIG. 3A. The optical image 305 acquired in this state includes the upper right portion of the sample 108.

Figure 3C:
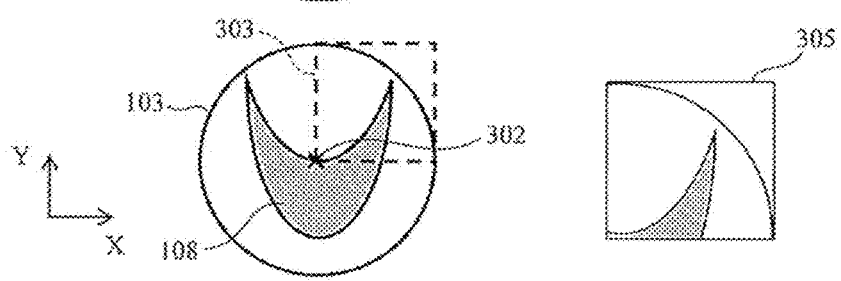

FIG. 3C illustrates a state in which the stage 104 is rotated counterclockwise by 90° from the state illustrated in FIG. 3B. The optical image 305 acquired in this state includes a portion of the sample 108 that is located at the lower right portion of the sample stage 103 at the time of the state of FIG. 3B.

Figure 3D:
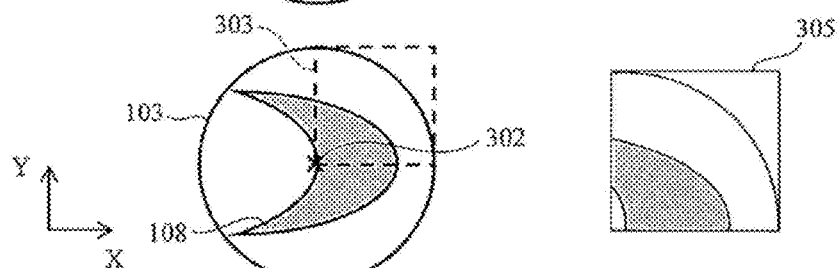

FIG. 3D illustrates a state in which the stage 104 is rotated further counterclockwise by 90° from the state illustrated in FIG. 3C. The optical image 305 acquired in this state includes a portion of the sample 108 that is located at the lower left portion of the sample stage 103 at the time of the state of FIG. 3B.

Figure 3E:
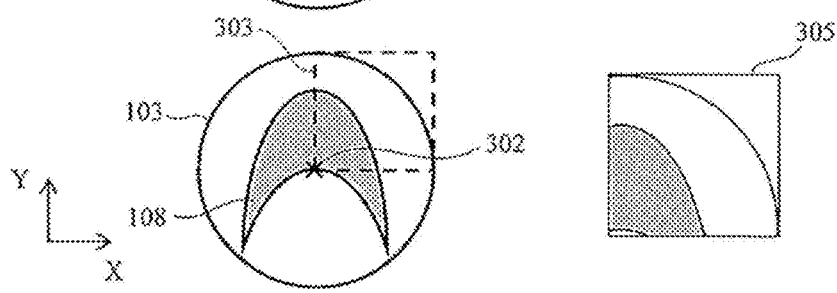

FIG. 3E illustrates a state in which the stage 104 is rotated further counterclockwise by 90° from the state illustrated in FIG. 3D. The optical image 305 acquired in this state includes a portion of the sample 108 that is located at the upper left portion of the sample stage 103 at the time of the state of FIG. 3B.

By doing so, after moving the sample stage 103 in the XY direction, an entire image of the sample 108 can be acquired by obtaining a plurality of optical images while further rotating the sample stage 103.

FIG. 4A illustrates an example in which a composite image including the entire sample 108 is generated by combining the four optical images 402 to 405 obtained in the states of FIGS. 3B to 3E. The combining operation can be executed by setting the stage coordinates at the time of capturing each optical image, the rotation angle of the stage 104, and the optical image magnification as factors. In the example of FIG. 4A, the combining is performed so that the optical image of FIG. 3E which has the latest acquisition order of the image is set to be on the frontmost side and the optical image is set to be on the rearer side as the acquisition order is older (earlier). The frontmost-side optical image is displayed in its entirety, but the optical images on the rearer side are partially shielded by the front-side optical image. The context of the plurality of optical images can be re-determined so that the deviation (seam) of the image of the sample 108 is minimized among the plurality of optical images. When the deviation among the images is large, the shape of the sample 108 is not reproduced accurately, and when the composite image is used for navigation, the positioning accuracy is decreased, and thus, it is appropriate to perform the combining so that the deviation is as small as possible.

FIG. 4B illustrates an example in which a composite image including the entire sample 108 is generated by combining the five optical images 401 to 405 obtained in the states of FIGS. 3A to 3E. In FIG. 4B, the composite image is generated so that the optical image 401 captured in the state of FIG. 3A is on the frontmost side. According to this combining method, it is possible to output an image without the deviation (seam) of the image (where most of the sample 108 is included) in the vicinity of the center of the sample 108, and it is possible to improve the navigation accuracy as compared with the case of FIG. 4A.

FIG. 5 is an example of an interface screen used from the capturing of the optical image (step S202) to the displaying of the composite image (step S207). In the capturing of the optical image (step S202), first, an image 501 for designation for designating the imaging position is displayed on the display unit 125. By checking imaging position display lines 502 displayed on the image 501 for designation, it is possible to check at which position on the sample stage 103 the optical image is acquired. The imaging position can be designated, for example, by adjusting slide bars of a horizontal imaging position setting portion 503 and a vertical imaging position setting portion 504 to adjust an intersection position of the imaging position display line 502.

After designating the imaging position, the user clicks an optical image taking-in portion 507 by using a mouse (an example of the input unit 124). The optical imaging device 150 receives this click signal through the arithmetic operation control unit 120 and captures an optical image at a designated location. The adjustment of the imaging position may be performed by buttons of a horizontal imaging position adjusting portion 505 and a vertical imaging position adjusting portion 506, in addition to the slide bars of the horizontal imaging position setting portion 503 and the vertical imaging position setting portion 504. In addition, the coordinate values may be directly input by using a keyboard or the like, or the imaging position may be designated by moving the pointer and clicking with a mouse or the like on the image 501 for designation. FIG. 5 also illustrates a context control portion 603 (described later) for controlling (changing) the context of the composite image.

In the example of FIG. 5, the imaging position of the optical image is manually designated, but a coordinate position may be stored in advance in the memory 151 of the arithmetic operation control unit 120. In addition, with respect to the designation of the imaging position, for example, when a total of five images including one image in the center and four images in the periphery are captured as illustrated in FIG. 4B, the designation of the imaging position may be performed for each of the five images. In addition, only the imaging position of the image in the center may be designated, and the imaging position of the images in the periphery may be automatically determined by the arithmetic operation control unit 120 according to the size of the sample 108.

Figure 6A:
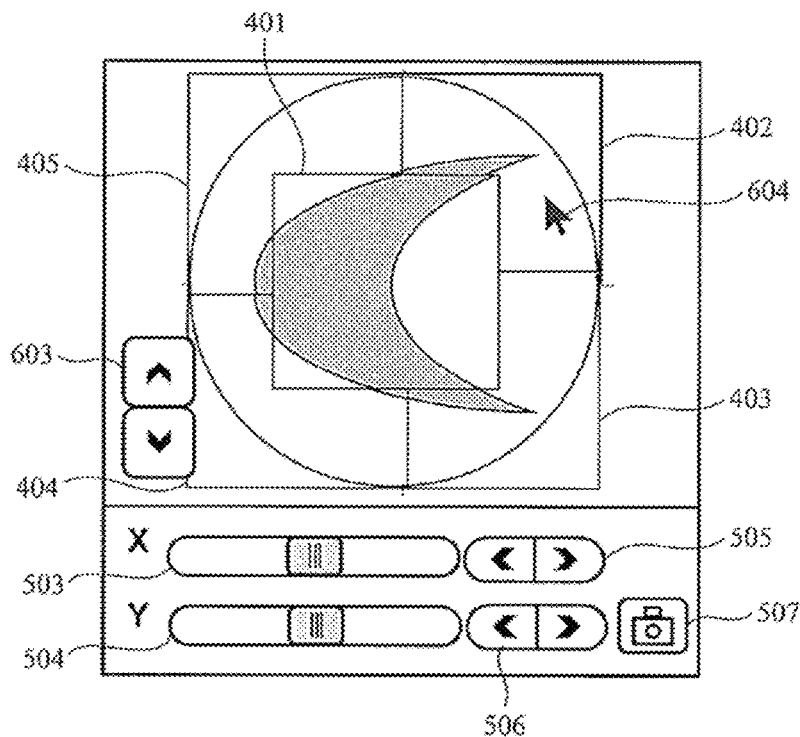
FIGS. 6A and 6B are examples of an interface screen for executing the procedure from the capturing of the optical image to the displaying of the composite image.
Figure 6B:
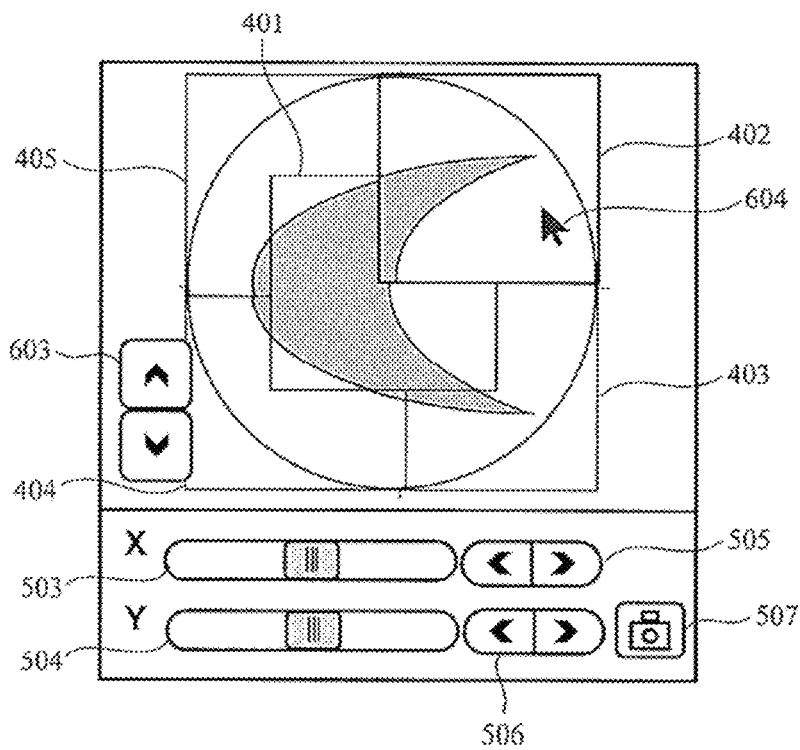

By doing so, for example, when a total of five optical images including one image in the center and the four images in the periphery are captured, the five optical images are combined in the image composition unit 1223, and a composite image thereof is displayed on the display unit 125. FIGS. 6A and 6B are examples of an interface screen including the composite image. FIG. 6A illustrates an example of a screen on which the composite image in an initial state is displayed, and FIG. 6B illustrates an example of a screen in which the composite image is re-generated and displayed according to a command.

FIG. 6A illustrates an interface screen when five optical images 401 to 405 are combined as an initial state to generate and display a composite image in a context in which the optical image 401 in the center is on the frontmost side. The user looks at the displayed composite image and selects the image to be displayed on the frontmost side among the five optical images 401 to 405 with a cursor 604 (the cursor 604 and the input unit 124 function as a selection unit that allows at least one of the plurality of optical images to be selected). For example, in the state of FIG. 6A, when the cursor 604 of the mouse is moved to the optical image 402 on the rearer side than the optical image 401, the context control portion 603 switches the contexts of the optical images 401 to 405 according to the contents of the operation. Therefore, for example, as illustrated in FIG. 6B, the selected optical image 402 can be moved to the frontmost side of the composite image. Accordingly, it is possible to perform the position presentation and positioning with an image having no seam and less distortion in the vicinity of the area which is to be navigated.

(Effect)

As described above, according to the charged particle beam apparatus according to the first embodiment, after moving the stage 104 in the XY direction so that the center of the imaging range (field of view) of the optical imaging device 150 is located at a position (second position) different from the rotation center (first position) of the stage 104, the stage 104 is rotated. Then, a plurality of optical images relating to different positions (rotation angles) are captured and acquired, and a composite image is generated by combining the plurality of optical images. By acquiring and combining the plurality of optical images by combining such movement in the XY direction and the rotation operation, the movement range of the stage 104 is limited, and thus, a low-magnification composite image can be obtained without requiring a large vacuum sample chamber.

In addition, by appropriately selecting a plurality of optical images constituting a composite image in a state in which the composite image is displayed, a new composite image of which context is switched can be displayed. At the time of combining the plurality of optical images, a step difference (seam) may occur among the images. By allowing the user to select the frontmost-side optical image in the composite image, navigation can be executed without being affected by such a step difference (seam).

The control of the context may be performed by input from the input unit 124 by the user, but the context of the image may be controlled and stored in the memory 151 of the arithmetic operation control unit 120 in advance, and the control may be performed according to the stored information of the context. In addition, at the time of displaying the composite image, the images may be combined into one image and displayed, or a plurality of images may be not combined into one image but displayed in a combined image on the display.

In the operation of FIG. 6, the selection of the optical image to be moved to the front side in the composite image may be executed simply by clicking the mouse or may be made by specifying the number or symbol designated to the optical image. In addition, the arithmetic operation control unit 120 may automatically control the context based on the information of the sample. For example, image processing may be performed to preferentially display the optical image containing most of the sample on the frontmost side. Alternatively, the height of the sample 108 may be measured and the context of the optical image may be controlled based on the measurement result. Therefore, it is possible to improve the positioning accuracy of the movement to the observation location.

Second Embodiment

Next, a charged particle beam apparatus according to a second embodiment of the present invention will be described with reference to FIGS. 7A and 7B. Since the overall configuration of the charged particle beam apparatus according to the second embodiment may be substantially the same as that of the first embodiment (FIG. 1), the duplicate description will be omitted. In addition, since the procedure for capturing optical images for generating a composite image and the procedure for generating a first composite image may be substantially the same as those in the first embodiment (FIGS. 3A to 4B), the duplicate description thereof will be omitted. However, in this second embodiment, the method of controlling the context of the plurality of optical images in the composite image is different from that of the first embodiment. Specifically, the second embodiment is different from the first embodiment in that, after a composite image is first generated, when the observation position corresponds to a boundary position of the plurality of optical images, an optical image is re-captured at the observation position and the composite image is re-generated by using the re-captured optical image.

Figure 7A:
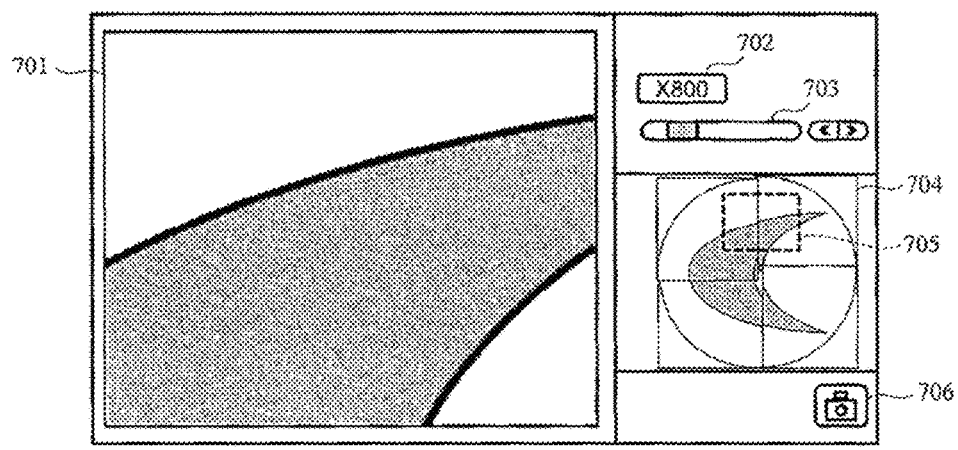
FIGS. 7A and 7B are examples of the interface screen of a charged particle beam apparatus according to a second embodiment of the present invention.
Figure 7B:
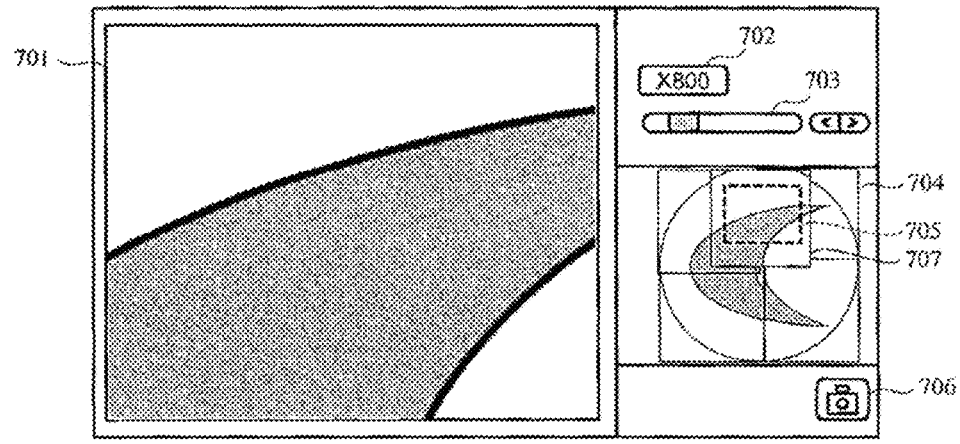

FIGS. 7A and 7B illustrate examples of an interface screen when the operation of re-capturing an optical image and re-generating a composite image is performed in the second embodiment. As an example, the interface screen of FIG. 7A includes an observation image display portion 701, an observation magnification display portion 702, an observation magnification adjusting portion 703, a navigation portion 704, and an optical image taking-in portion 706.

The observation image display portion 701 is a portion that displays the observation image captured by the charged particle beam imaging device 110. In addition, the observation magnification display portion 702 displays the observation magnification of the observation image of the observation image display portion 701, and the observation image magnification adjusting portion 703 has a slide bar and/or a button for adjusting the observation magnification. The navigation portion 704 is a display portion that displays a composite image and an indicator 705 that indicates the observation image displayed on the observation image display portion 701 is displayed inside the navigation portion 704. The indicator 705 may be a rectangular mark as illustrated and may be a cross mark or a dot mark indicating only the position of the stage 104.

The optical image taking-in portion 706 is an interface for taking the optical image by the optical imaging device 150, and when the portion is clicked, the optical image is captured centered on the current observation position, in other words, at the display portion of the indicator 705. Then, the composite image including the captured new optical image is newly combined in the image composition unit 1223. At that time, as illustrated in FIG. 7B, the newly captured optical image is combined so as to be on the frontmost side of the composite image. After the composite image is re-generated in this manner, similarly to the first embodiment, it is also possible to select any one of the plurality of optical images in the composite image with a mouse or the like to put the image on the frontmost side.

(Effect)

As described above, according to the second embodiment, if the observation is started by the charged particle beam imaging device 110 after a composite image is generated by combining the plurality of optical images acquired by the optical imaging device 150, when the observation position satisfies a predetermined condition (for example, when the observation position includes a boundary between the plurality of images), the optical imaging device 150 re-captures an optical image of the sample at the observation position to re-generate the composite image. According to the second embodiment, at the observation position, it becomes easy to observe a composite image without a step difference (seam) that may occur at a boundary between the images.

Third Embodiment

Next, a charged particle beam apparatus according to a third embodiment of the present invention will be described with reference to FIGS. 8A and 8B. Since the overall configuration of the charged particle beam apparatus according to the third embodiment may be substantially the same as that of the first embodiment (FIG. 1), the duplicate description thereof will be omitted. In addition, since the procedure for capturing optical images for generating a composite image and the procedure for generating a first composite image may be substantially the same as those in the first embodiment (FIGS. 3A to 4B), the duplicate description thereof will be omitted below. However, in the third embodiment, the method of controlling the context of the plurality of optical images in the composite image is different from that of the first embodiment. Specifically, the third embodiment is different from the first embodiment in that, after a composite image is first generated, the composite image is re-generated by changing the context of the plurality of optical images in the composite image according to the change in the observation position.

Figure 8A:
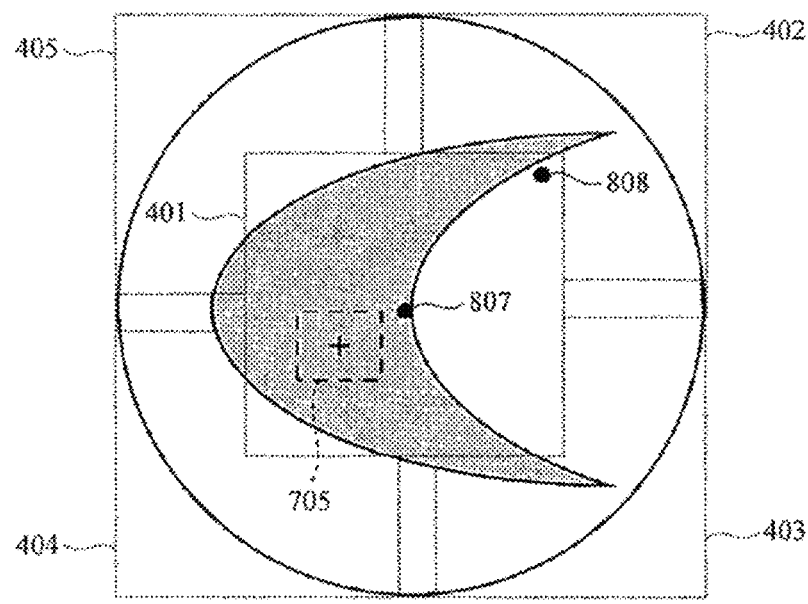
FIGS. 8A and 8B are examples of the interface screen of a charged particle beam apparatus according to a third embodiment of the present invention.
Figure 8B:
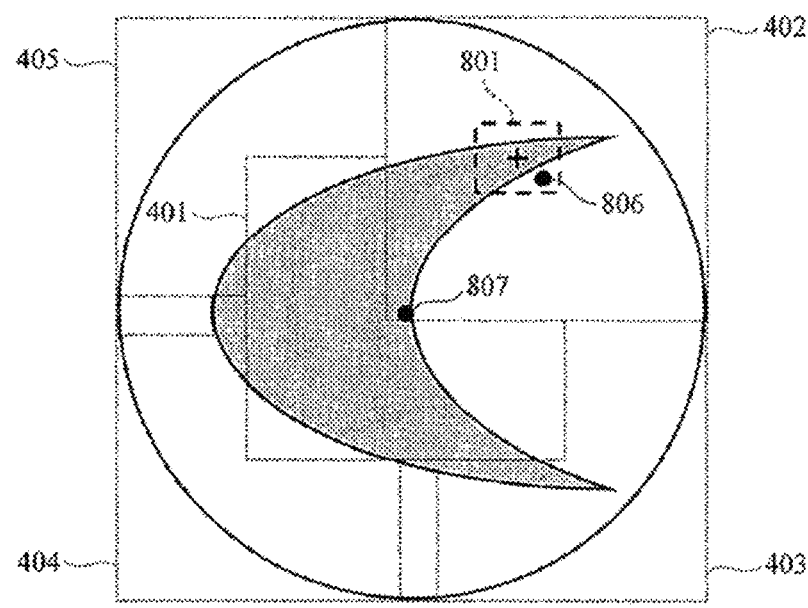

FIGS. 8A and 8B illustrate display examples when a composite image is first generated and displayed on the display unit 125, and then, the composite image is re-generated. Since the display other than the navigation portion 704 may be the same as that of the second embodiment, the illustration thereof will be omitted. Similar to the above-described embodiment, FIGS. 8A and 8B illustrate examples in which a composite image is generated by combining five optical images including the optical images 401 to 405.

In FIG. 8A, the observation position observed by the charged particle beam imaging device 110 is indicated by the indicator 705. In this embodiment, the optical image at the position of the indicator 705 indicating the observation position is combined so as to be on the frontmost side of the composite image. In FIG. 8A, the observation position indicated by the indicator 705 is at the center of the sample stage 103. For this reason, the composite image is generated and displayed so that the optical image 401 in the center is on the frontmost side. On the other hand, when the observation position is moved to the periphery side, for example, the upper right portion of the sample stage 103 as illustrated in FIG. 8B, the position of the indicator 705 is closer to the center position 806 of the optical image 402 in the upper right portion than to the center position 807 of the optical image 401 at the center. For this reason, the image composition unit 1223 of the arithmetic operation control unit 120 re-generates and displays the composite image so that the optical image 402 at the position to which the indicator 705 is the closest is on the frontmost side of the composite image. As a result, it is possible to provide a composite image having no step difference or seam at the observation position (in the vicinity of the indicator 705). In the third embodiment, in addition to the control of the context according to the observation position, the control (FIGS. 6A and 6B) of the context according to the selection of the user and the re-capturing (FIGS. 7A and 7B) of the image at the observation position when the observation position satisfies a predetermined condition can be performed.

Fourth Embodiment

Next, a charged particle beam apparatus according to a fourth embodiment of the present invention will be described with reference to FIGS. 9 and 10.

Figure 9:
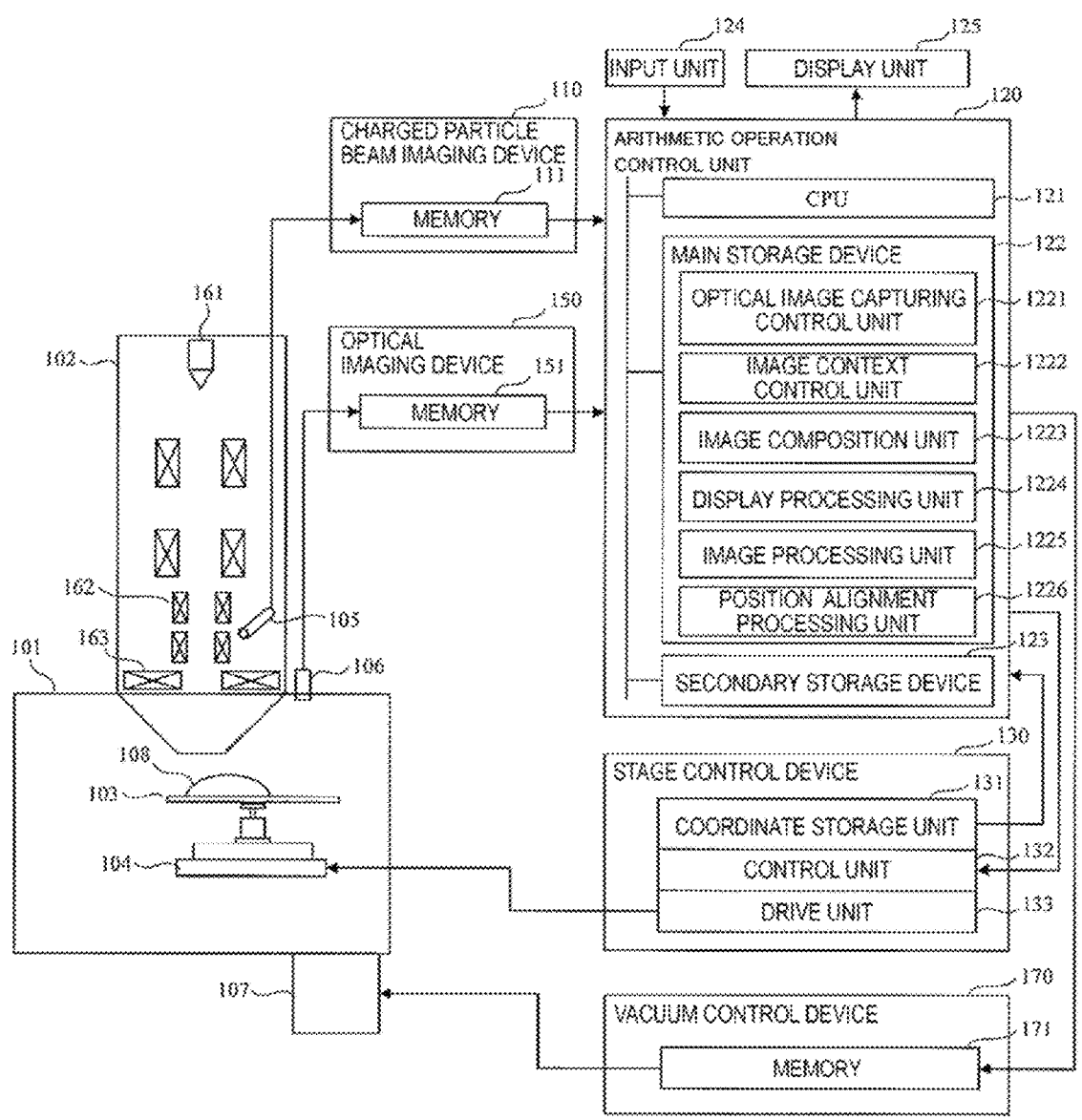
FIG. 9 is an example of a schematic diagram of a charged particle beam apparatus according to a fourth embodiment of the present invention.
Figure 10:
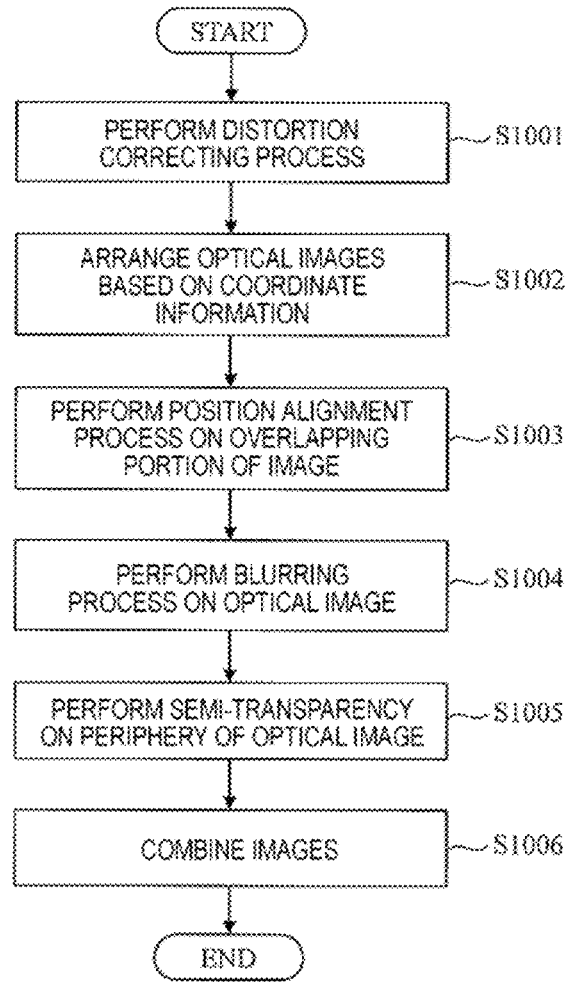
FIG. 10 is a flowchart for illustrating a process of correcting an image by the image processing unit of the charged particle beam apparatus according to the fourth embodiment.

FIG. 9 is a schematic view illustrating the overall configuration of the charged particle beam apparatus according to the fourth embodiment and FIG. 10 is a flowchart illustrating a procedure for generating and displaying a composite image. In the apparatus of FIG. 9, since the same components as those of the first embodiment (FIG. 1) are denoted by the same reference numerals in FIG. 9, the duplicate description thereof will be omitted below, and different components will be mainly described.

The charged particle beam apparatus according to the fourth embodiment further includes an image processing unit 1225 and a position alignment processing unit 1226 in addition to the configuration of the first embodiment. The image processing unit 1225 has a function of performing image processing such as a blurring process and a semi-transparency process on each optical image when a plurality of optical images are generated. The position alignment processing unit 1226 executes processing for position alignment (matching, correcting) between the adjacent optical images.

The procedure (corresponding to step 206 in FIG. 2) for generating a composite image in the charged particle beam apparatus according to the fourth embodiment will be described with reference to the flowchart of FIG. 10. In step S1001, a distortion correcting process is performed on the input optical image. The distortion may be corrected based on distortion characteristics acquired in advance, or the distortion may be corrected by estimating a distortion amount from the input image.

In the following step S1002, the plurality of optical images are arranged based on the coordinate information of the plurality of optical images. Then, in step S1003, matching (position alignment) between the images is executed by using the overlapping portion between the plurality of optical images, and the position is further corrected. The matching at this time can employ a known method and is not limited to a specific one. For example, by using a portion of one image as a template, a search may be performed on other images, and template matching may be performed to specify the position, or feature point matching of extracting feature points on one image and similarly extracting feature points on the other images to perform matching may be performed. In addition, by utilizing the AI technology, the same location as the overlapping portion may be determined.

Then, in step S1004, the blurring process is performed on the optical image of the overlapping portion and the periphery thereof. Further, in step S1005, the semi-transparency process is performed on the optical image of the overlapping portion and the periphery thereof. In step S1006, the plurality of images on which the blurring process and the semi-transparency process are performed are combined. The image obtained from the above-mentioned result can be output as one image having no influence of distortion and fewer seams between the images. The semi-transparency process may be performed only on the upper image in the overlapping portion, but the lower image of the overlapping image may also be a target of the semi-transparency process. The image output in this step may be used as it is for the navigation purpose, or another optical image may be additionally acquired and combined with respect to the output image under the control of the context to be displayed.

Fifth Embodiment

Figure 11:
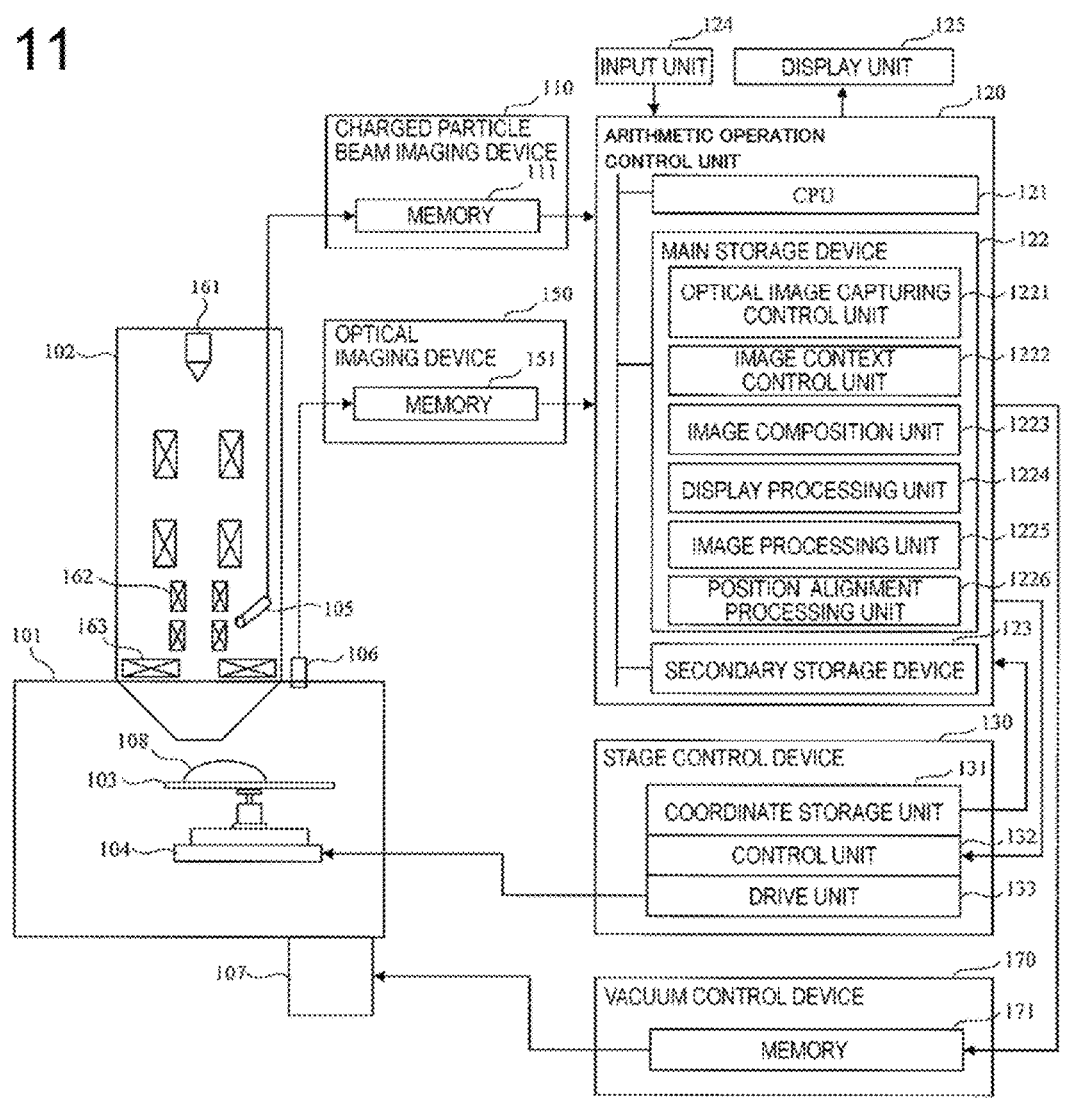
FIG. 11 is an example of a schematic diagram of a charged particle beam apparatus according to a fifth embodiment of the present invention.

Next, the charged particle beam apparatus according to a fifth embodiment of the present invention will be described with reference to FIG. 11. FIG. 11 is a schematic view illustrating the overall configuration of the charged particle beam apparatus according to the fifth embodiment. In the apparatus of FIG. 11, since the same components as those of the first embodiment (FIG. 1) are denoted by the same reference numerals in FIG. 11, the duplicate description thereof will be omitted below and different components will be mainly described.

The charged particle beam apparatus according to the fifth embodiment is configured to further include a light source 1101 and a light source control device 1110 in addition to the configuration of the first embodiment. The light source 1101 is a light source provided for illuminating the inside of the sample chamber 101, and the amount of light, the timing of illumination, and the like are controlled by the light source control device 1110. The light source control device 1110 includes a control unit 1111 and a drive unit 1112. The control unit 1111 controls the operation of the entire light source control device 1110. The drive unit 1112 generates a drive signal to drive the light source 1101.

The light source 1101 irradiates the sample chamber 101 with the light source 1101, and the optical camera 106 captures images of the sample stage 103 and the sample 108 with the reflected light of the irradiation light to generate the above-mentioned composite image. The method of generating the composite image may be similar to that of the above-described embodiment. The light source 1101 may be a white light source or a light source limited to a specific wavelength. In addition, as the type of the light source, various types such as a lamp light source, a light emitting diode, and a laser light source can be employed. The light source 1101 can also be provided with a diffusing plate or a projection optical system (not illustrated). In the fifth embodiment, by providing such a light source 1101, it is possible to capture the optical image even during evacuation or after vacuum exhaustion. When the optical image can be captured during evacuation and the composite image can be generated, the time required for imaging can be shortened and the throughput of inspection can be improved.

Sixth Embodiment

Figure 12:
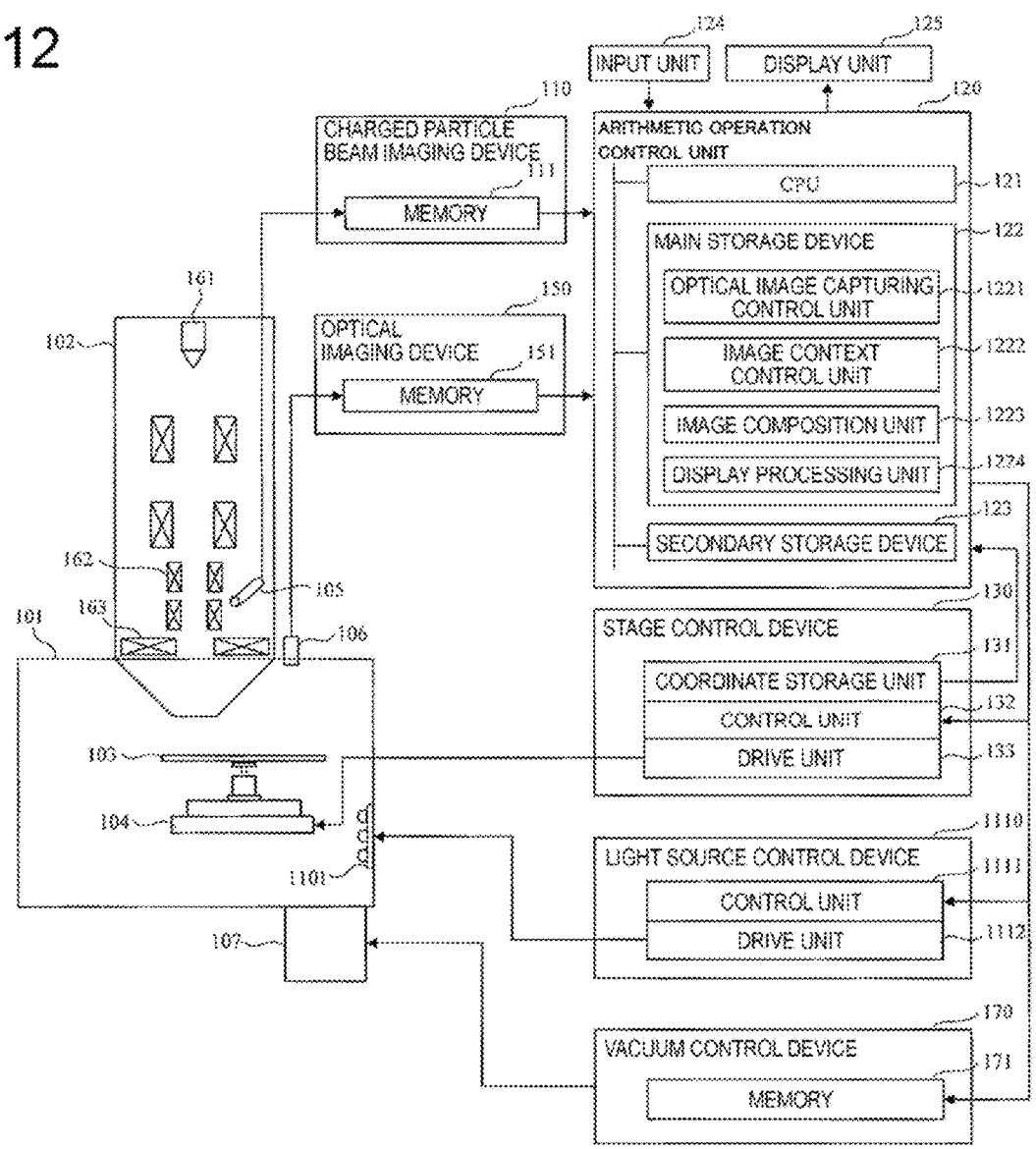
FIG. 12 is an example of a schematic diagram of a charged particle beam apparatus according to a sixth embodiment of the present invention.

Next, a charged particle beam apparatus according to a sixth embodiment of the present invention will be described with reference to FIG. 12. FIG. 12 is a schematic view illustrating the overall configuration of the charged particle beam apparatus according to the sixth embodiment. In the apparatus of FIG. 12, since the same components as those of the first embodiment (FIG. 1) are denoted by the same reference numerals in FIG. 11, the duplicate description thereof will be omitted below and different components will be mainly described.

The charged particle beam apparatus according to the sixth embodiment includes a plurality of optical cameras, for example, two optical cameras (first optical camera 1201 and second optical camera 1202) in addition to the above-described embodiment. The first optical camera 1201 has a larger angle of view and can capture a wider field of view than the second optical camera 1202. By switching and displaying the context of the plurality of types of images in this manner, the positioning process becomes easier. For example, the position to be imaged by the second optical camera is designated from the image acquired by the first optical camera 1201. From this imaging result, when the display magnification of the navigation image is allowed to be large, the context of the image may be controlled and the image of the second optical camera 1202 may be displayed on the front surface to improve the navigation accuracy. There is no problem that any one of the first optical camera 1201 and the second optical camera 1202 has a larger angle of view. In addition, the number of optical cameras is not limited to two and may be three or more.

The present invention is not limited to the above-described embodiments and includes various modified examples. For example, the above embodiments have been described in detail in order to explain the present invention for easy understanding, and the embodiments are not necessarily limited to those having all the described configurations. In addition, a portion of the configuration of one embodiment can be replaced with a configuration of another embodiment, and a configuration of one embodiment can be added to a configuration of another embodiment. In addition, with respect to a portion of the configuration of each embodiment, addition, deletion, and replacement with another configuration are possible.

REFERENCE SIGNS LIST

101: sample chamber
102: charged particle beam optical system
103: sample stage
104: stage
105: detector
106: optical camera
107: vacuum pump
108: sample
110: charged particle beam imaging device
111: memory
120: arithmetic operation control unit
122: main storage device
123: secondary storage device
124: input unit
125: display
130: stage control device
131: coordinate storage unit
132: control unit
133: drive unit
150: optical imaging device
151: memory
161: electron source
162: deflector
163: objective lens 170: vacuum control device
171: memory
302: rotation center
303: imaging range
305: optical image
401 to 405: optical image
501: image for designation
502: imaging position display line
503: horizontal imaging position setting portion
504: vertical imaging position setting portion
505: horizontal imaging position adjusting portion
506: vertical imaging position adjusting portion
507: optical image taking-in portion
603: context control portion
604: cursor
701: observation image display portion
702: observation magnification display portion
703: observation image magnification adjusting portion
703: observation magnification adjusting portion
704: navigation portion
705: indicator
706: optical image taking-in portion
807: center position
1101: light source
1110: light source control device
1111: control unit
1112: drive unit
1201: first optical camera
1202: second optical camera
1221: optical image capturing control unit
1222: image context control unit
1223: image composition unit
1224: result display unit
1225: image processing unit
1226: position alignment processing unit

The invention claimed is:

1. A charged particle beam apparatus comprising:
a charged particle beam optical system that irradiates a sample mounted on a sample stage with a charged particle beam;
a detector that detects a signal generated from the sample;
a charged particle beam imaging device that acquires an observation image from the signal detected by the detector;
an optical imaging device that captures an optical image of the sample;
a stage that rotatably holds the sample stage;
a stage control device that controls the stage;
an image composition unit that combines a plurality of the optical images to generate a composite image;
an image context control unit that controls context of the plurality of optical images, such that a frontmost-side optical image among the plurality of the optical images is displayed in its entirety, but rearer-side optical image other than the frontmost-side optical image are partially shielded by the frontmost-side optical image;
a display unit that displays the composite image;
a light source for illuminating a sample chamber; and
a light source control device for controlling the light source, wherein
the optical imaging device illuminates the sample chamber with the light source to capture the optical image during executing an operation of evacuation of the sample chamber, and
the image composition unit combines the plurality of optical images according to the context.

2. The charged particle beam apparatus according to claim 1, wherein
the image context control unit controls the context according to an observation position by the charged particle beam imaging device.

3. The charged particle beam apparatus according to claim 1, wherein
the display unit includes a selection unit that selects at least one of the plurality of optical images constituting the composite image, wherein
the image composition unit combines the plurality of optical images according to the result of selection in the selection unit.

4. The charged particle beam apparatus according to claim 1, wherein
the image composition unit is configured to be able to perform a blurring process on the optical images when the plurality of optical images are combined.

5. The charged particle beam apparatus according to claim 1, wherein
the image composition unit is configured to be able to perform a semi-transparency process on the optical images when the plurality of optical images are combined.

6. The charged particle beam apparatus according to claim 1, wherein
the optical imaging device includes a plurality of cameras having different angles of view.

7. A charged particle beam apparatus comprising:
a charged particle beam optical system that irradiates a sample mounted on a sample stage with a charged particle beam;
a detector that detects a signal generated from the sample;
a charged particle beam imaging device that acquires an observation image from the signal detected by the detector;
an optical imaging device that captures an optical image of the sample;
a stage that rotatably holds the sample stage;
a stage control device that controls the stage;
an image composition unit that combines a plurality of the optical images to generate a composite image;
an image context control unit that controls context of the plurality of optical images, such that a frontmost-side optical image among the plurality of the optical images is displayed in its entirety, but rearer-side optical images other than the frontmost-side optical image are partially shielded by the frontmost-side optical image;
a display unit that displays the composite image;
a light source for illuminating a sample chamber; and
a light source control device for controlling the light source, wherein
the optical imaging device illuminates the sample chamber with the light source to capture the optical image during executing an operation of evacuation of the sample chamber,
when an observation position observed by the charged particle beam imaging device satisfies a predetermined condition, the optical imaging device captures an image of the sample at the observation position, and
the image composition unit re-generates the composite image by using the captured image.

8. The charged particle beam apparatus according to claim 7, wherein
the stage control device rotates the stage to acquire the plurality of optical images.

9. The charged particle beam apparatus according to claim 7, further comprising
an image context control unit that controls context of the plurality of optical images, wherein
the image composition unit combines the plurality of optical images according to the context.

10. The charged particle beam apparatus according to claim 7, wherein
the image composition unit generates the composite image so that the image captured at the observation position is on the front side when the composite image is re-generated.

11. The charged particle beam apparatus according to claim 7, wherein
the display unit includes a selection unit for selecting the plurality of optical images constituting the composite image, and
the image composition unit combines the plurality of optical images according to the result of selection in the selection unit.

12. The charged particle beam apparatus according to claim 7, wherein
the predetermined condition is that the observation position observed by the charged particle beam imaging device includes a boundary between the plurality of images, and
when the predetermined condition is satisfied, the optical imaging device captures an image of the sample at the observation position, and
the image composition unit re-generates the composite image by using the captured image.

* * * * *